(12) United States Patent
Ullmann et al.

(10) Patent No.: US 9,826,637 B2
(45) Date of Patent: Nov. 21, 2017

(54) FILM AND BODY WITH SUCH A FILM (71) Applicant: POLYIC GMBH & CO. KG, Fürth (DE)

(72) Inventors: Andreas Ullmann, Zirndorf (DE); Walter Fix, Furth (DE); Manfred Walter, Nuremberg (DE); Thomas Herbst, Edelsfeld (DE)

(73) Assignee: Poly IC GmbH & Co. KG, Furth (DE)

( * ) Notice: Subject to any disclaimer, the term of this patent is extended or adjusted under 35 U.S.C. 154(b) by 244 days.

(21) Appl. No.: 14/431,436

(22) PCT Filed: Oct. 14, 2013

(86) PCT No.: PCT/EP2013/071387
§ 371 (c)(1),
(2) Date: Mar. 26, 2015

(87) PCT Pub. No.: WO2014/060334
PCT Pub. Date: Apr. 24, 2014

(65) Prior Publication Data
US 2015/0257265 A1 Sep. 10, 2015

(30) Foreign Application Priority Data

Oct. 15, 2012 (DE) .......... 10 2012 109 820
Feb. 1, 2013 (DE) .......... 10 2013 101 064

(51) Int. Cl.
*G01R 27/26* (2006.01)
*G06F 3/044* (2006.01)
(Continued)

(52) U.S. Cl.
CPC .......... *H05K 1/11* (2013.01); *B29C 45/14639* (2013.01); *B29C 45/14811* (2013.01);
(Continued)

(58) Field of Classification Search
CPC ............... G06F 3/044; G06F 3/045; G06F 2203/04103; G09G 5/00; H05K 1/02;
(Continued)

(56) References Cited

U.S. PATENT DOCUMENTS 4,113,981 A 9/1978 Fujita et al.
5,003,222 A 3/1991 Washo
(Continued)

FOREIGN PATENT DOCUMENTS

DE 102007057934 A1 6/2009
DE 102010044598 B3 1/2012
(Continued)

OTHER PUBLICATIONS

Designlosungen mit gesteigerter functionalitat, Frank Ehrig et al. Swiss Plastics Jun. 2011 pp. 16-17.
(Continued)

*Primary Examiner* — Arleen M Vazquez
*Assistant Examiner* — Neel Shah
(74) *Attorney, Agent, or Firm* — William Squire (57) ABSTRACT

A film (2) which has at least one electric or electronic functional layer (22), wherein at least one electric and/or electronic component is provided in a functional area of the functional layer (22), and wherein at least one electrical connection is provided in a contact area of the at least one functional layer (22), which electrical contact is galvanically coupled to at least one component, wherein the film (2) has a contact flap which provides at least one part of the contact area (20b, 20b'), has a further layer (23a, 23b, 24"), in a thickness of at least 300 nm and preferably at least 1 μm, particularly preferably of at least 7 μm, on the functional layer (22) at least in a transition area (20c) between the functional area (20a) and the contact area (20b), which comprises at least a partial area of the contact flap. Alter-
(Continued)

natively, in a transition area the flap can taper away from the functional area.

25 Claims, 11 Drawing Sheets (51) Int. Cl.
G06F 3/045 (2006.01)
G09F 5/00 (2006.01)
G01B 7/14 (2006.01)
H05K 1/11 (2006.01)
B29C 45/14 (2006.01)
H05K 1/02 (2006.01)
H05K 1/03 (2006.01)
H05K 1/18 (2006.01)

(52) U.S. Cl.
CPC ......... G01R 27/2605 (2013.01); G06F 3/044 (2013.01); H05K 1/0274 (2013.01); H05K 1/0373 (2013.01); H05K 1/118 (2013.01); H05K 1/181 (2013.01); H05K 1/189 (2013.01); H05K 2201/0108 (2013.01); H05K 2201/053 (2013.01); H05K 2201/10151 (2013.01)

(58) Field of Classification Search
CPC ... H05K 1/03; H05K 1/11; H05K 1/18; G01R 27/26; G01B 7/14; G09F 5/00
USPC .......................... 324/658; 345/156, 173–174
See application file for complete search history.

(56) References Cited

U.S. PATENT DOCUMENTS

| | | | | |
|---|---|---|---|---|
| 6,473,074 B1* | 10/2002 | Okahashi | ............. | G06F 3/0414 345/174 |
| 2002/0066973 A1 | 6/2002 | Visconti et al. | | |
| 2004/0061688 A1* | 4/2004 | Nakayama | ............. | G06F 3/041 345/173 |
| 2006/0082556 A1* | 4/2006 | Baker | ................. | G06F 3/0362 345/173 |
| 2008/0143683 A1* | 6/2008 | Hotelling | ............. | G06F 3/0416 345/173 |
| 2008/0213541 A1 | 9/2008 | Shilling et al. | | |
| 2011/0128033 A1* | 6/2011 | Ohsawa | ................ | G11B 5/486 324/763.01 |
| 2011/0134655 A1 | 6/2011 | Ohtani et al. | | |
| 2012/0267229 A1 | 10/2012 | Lin | | |
| 2014/0145731 A1 | 5/2014 | Bolte et al. | | |
| 2014/0218053 A1* | 8/2014 | Ullmann | ................. | G01B 7/14 324/658 |
| 2015/0257265 A1 | 9/2015 | Ullman et al. | | |
| 2015/0293558 A1 | 10/2015 | Hahn et al. | | |

FOREIGN PATENT DOCUMENTS

| | | |
|---|---|---|
| DE | 10 2010 032 951 A1 | 2/2012 |
| DE | 102011006402 A1 | 10/2012 |
| DE | 10 2011103824 A1 | 12/2012 |
| EP | 1 100 043 A2 | 5/2001 |
| EP | 2 228 258 A2 | 9/2010 |
| EP | 2695715 A | 2/2014 |
| JP | 2009238661 A | 10/2009 |
| WO | WO99/17261 | 4/1999 |
| WO | WO2010/072163 A1 | 7/2010 |

OTHER PUBLICATIONS

Touchskin-nicht touchscreen Plastverabeiter Richard Bauer Dec. 2010 pp. 30-34.
Examination Report German corresponding application.
Search Report PCT/EP2014/060946 corresponds to DE Int'l application.
Search Report PCT/EP2013/071388 corresponds to current pat application.
Search Report PCT /EP2013/071387 corresponds to current pat application.
Examination report DE102013 105 802.7 corresponds to DE applic.
Examination report DE 10 2013 101 064.4 corresponds to DE applic.
Design Solutions with enhanced functionality, Swiss Plastics Jun. 2011, pp. 16-17, Frank Ehrig and Guido Schuster.

* cited by examiner

Fig. 1a
(State of the art)

Fig. 1b
(State of the art)

FILM AND BODY WITH SUCH A FILM

The invention relates to a film which has at least one electric or electronic functional layer. At least one electric and/or electronic component is provided in a functional area of the functional layer; at least one electrical connection is provided in a contact area of the at least one functional layer, which electrical connection is galvanically coupled to at least one component, namely is galvanically coupled in the functional layer, via (contact) connections in the latter.

The film has, in particular, a contact flap which at least partly provides the contact area.

Such a film can provide, for example, a touch panel functionality; in which case it has capacitive elements and can also be called a sensor film. Alternatively (or in addition), the film can carry light-emitting diode elements (for instance organic light-emitting diodes).

Such films can be put per se to an intended use without further action. However, it is usual to integrate such a film into a body, which is in particular a plastic part, in order to reinforce the film and thus to stabilize it and protect it from damage. The body can then also be used in a device as a finished component.

A customary procedure for integrating a film into such a body is to back-injection mold the film. Alternatively, it is also possible to glue, clamp or laminate the film onto an already produced base body.

The invention correspondingly also relates to a body, namely a plastic part. The plastic part is preferably produced using an in-mold method.

In the case of an in-mold method, a distinction is drawn between in-mold labeling (IML) and in-mold decoration (IMD). In the in-mold method, in particular, a film is back-injection molded. In in-mold labeling this entire film becomes part of the finished body or plastic part here. In in-mold decoration a roll-to-roll method is used in which a strip of film is guided through the injection mold. The strip of film has a carrier layer and a transfer layer. The transfer layer can be detached from the carrier layer. After the back-injection molding, the transfer layer remains on the finished body, whereas the carrier layer is removed and conveyed further.

The film is usually partially back-injection molded such that the contact area is at least partially free from the injection-molded plastic material. The contact flap of the film here is not back-injection molded, or is only back-injection molded in a projection area, and thus can protrude and be guided to a counter contact. The contact flap must accordingly have a certain degree of flexibility. Care must be taken that the contact flap as such is not damaged, and also that contact traces (conductor traces) on the contact flap are not damaged.

The object of the invention is to demonstrate a way of designing a film of the type mentioned at the beginning and a body which is, in particular, produced as a plastic part using an in-mold method, in order to prevent, in a particularly reliable manner, damage from occurring during the contacting.

The object is achieved by a film with at least one electric or electronic functional layer, wherein at least one electric and/or electronic component is provided in a functional area of the functional layer, and wherein at least one electrical connection is provided in a contact area of the at least one functional layer, which electrical contact is galvanically coupled (in particular via connections in the functional layer) to at least one component, and wherein the film has a contact flap which provides at least one part of the contact area, wherein a further layer is applied, in a thickness of at least 300 nm, preferably at least of 1 μm, quite particularly preferably at least of 7 μm, to the functional layer in a transition area between the functional area and the contact area, which transition area comprises at least a partial area of the contact flap, and/or wherein in a transition area the flap tapers away from the functional area, and reduces its width in particular by at least 20%, preferably 40% of an initial width.

The object is also achieved by a body which has a film with at least one electric or one electronic functional layer, wherein at least one electric and/or electronic component is provided in a functional area of the functional layer, and wherein at least one electrical connection is provided in a contact area of the at least one functional layer, which electrical connection is galvanically coupled (in particular via connections in the functional layer) to at least one component, wherein the body furthermore comprises a plastic main material to which the film is partially joined such that the contact area is at least partially free from plastic main material, with the result that a contact flap protrudes, wherein a further (material) layer is applied, in a thickness of at least 300 nm, preferably at least of 1 μm, quite particularly preferably at least of 7 μm, to the functional layer in a transition area between the functional area and the contact area, which comprises at least a partial area of the contact flap, and/or in a transition area the flap tapers away from the functional area, and reduces its width in particular by at least 20%, preferably 40% of an initial width.

The present invention includes the idea of using the further layer to protect the contact flap itself, as a whole, or the functional layer there from damage. This is guaranteed in particular by the specified thickness of the further layer; this is true to a particular extent when the electric or electronic functional layer has a customary thickness (of e.g. between 10 and 50 nm) and/or when a substrate which carries the electric or electronic functional layer has a corresponding typical thickness of a few micrometers. Towards the top, there is no need to set a limit for the thickness of the further layer as long as the contact flap still remains sufficiently flexible. The back-injection molded area ends precisely in the transition area, and the contact flap thus begins. Precisely at this sensitive point, the further layer ensures that there is no danger, or at least a reduced danger, that the flap will be ripped or torn off or that the electric or electronic functional layer will be damaged at the transition from plastic main material to an area free from plastic main material, e.g. that contact traces will be ripped.

In the second aspect, according to which, in a transition area, the flap tapers away from the functional area, the shape of the flap itself guarantees that the flap is not damaged as quickly when it is bent for the purpose of contact with a counter contact.

In a variant the further layer has an electrically insulating material. The electrically insulating material prevents electrical flashovers onto the electronic components and corresponding connection lines. In particular, a suitable plastic material, for instance adapted to a substrate arranged under the electric or electronic functional layer, can be selected as electrical insulation material.

For example, the electrically insulating material can comprise polymethyl (meth)acrylate (PMMA), polycarbonate and/or acrylonitrile butadiene styrene (ABS) and/or contain zinc oxide particles.

The material can be applied to the electric functional layer in the form of a varnish as further layer, which ensures a particularly good cohesion.

However, it can also be provided in the form of a separate film which can be applied particularly easily in a production process.

It can be provided that a substrate carries the electric or electronic functional layer. In an embodiment the electrical insulating material then has a thickness deviating from the thickness of the substrate by at most +/−10%. This embodiment is suitable when the electrically insulating material is the same material as the material used for the substrate or is at least a comparable material, in particular in respect of its bending properties (modulus of elasticity). In a second embodiment, however, the electrically insulating material is harder than the substrate and can therefore be designed thinner than the latter.

In a second variant in respect of the aspect of providing the further layer, the latter comprises an electrically conductive material. The use thereof is suitable in particular for protecting electrical connection traces (contact traces) from damage and at the same time supporting their operation.

The electrically conductive material can in particular comprise conductive silver or carbon black. Such material can be printed particularly well.

In addition to the provision of this electrically conductive material in the transition area between the functional area and the contact area, the electrically conductive material can in particular also be provided at a free end of the contact flap and cover the electrical connection of the functional layer. The electrical connection is hereby strengthened beyond the layer thickness of the functional layer precisely at the connection end, with the result that any possible damage is effectively prevented during connection to a counter contact.

As an additional procedure for strengthening the free end of the flap on the side of the electric or electronic functional layer, a stiffening element can be provided on the side of the film facing away from the functional layer; such a strengthening element can make possible a secure connection of the contact area, via the contact flap, to a counter contact. The strengthening element can consist of polyethylene terephthalate, polypropylene, polycarbonate or polyethylene naphthalate and here can have such a film thickness that the total thickness of the remaining film with the strengthening element lies in the range of from 150 to 600 µm, e.g. is 300 µm. The electrically conductive material at least partly forming the further layer can have a thickness from the range of from 1 to 15 µm, preferably 2 to 5 µm.

The two variants of the use of electrically insulating material and of electrically conductive material for the further layer are not mutually exclusive: thus, electrically conductive material can be provided on the electric functional layer, in particular only in areas, and electrically insulating material can cover the electrically conductive material in the transition area, but can leave electrically conductive material exposed at the free end of the contact flap. In this embodiment the electrically insulating material's positive property of having a particularly good flexibility with a large layer thickness is associated with the advantage that the electrically conductive material strengthens the electric functional layer, in particular protects it from abrasion at the free end.

The electric or electronic functional layer can also comprise such conductive traces made of metal, in particular the named materials, which are at least 100 µm wide. Such traces are very visible per se, but can be masked by a plastic material, for instance in a separate decoration layer or by the substrate.

In another embodiment the electric functional layer has organic conductors such as PAni (polyaniline) or PEDOT/PSS (poly-3,4-ethylenedioxythiophene-polystyrenesulfonate). Moreover, the electric or electronic functional layer can comprise metal nanowires (e.g. made of silver, copper or carbon nanotubes, carbon nanoparticles or graphene). Furthermore, combinations of the named materials can be provided in the functional layer.

The film usually comprises an already mentioned substrate which carries the further layers and in particular the functional layer. This substrate consists of plastic, wherein in particular polyethylene terephthalate, polypropylene, polycarbonate, polyethylene naphthalate are suitable, preferably in a thickness from the range of from 12 to 150 µm, particularly preferably from the range of from 35 to 60 µm.

In a variant the substrate is arranged between the functional layer and the plastic main material. In this case the further layer lies on the side of the substrate facing away from the plastic main material on the functional layer.

In another variant the functional layer is arranged between the substrate and the plastic main material, thus points towards the injection-molding material. In this case the further layer is also arranged between the substrate and the plastic main material, because it is in fact arranged on the functional layer.

In the second aspect of the invention with the tapering contact flap, the functional layer preferably has, in the contact area to at least one connection, such a contact trace (connection line) which widens towards the transition area. Because the contact trace is wider in the transition area than elsewhere, during a bending movement in respect of the contact flap it is possible to prevent the contact trace as a whole from being interrupted.

In principle any thermoplastic is suitable as plastic main material which is injection-molded, acrylonitrile butadiene styrene (ABS), polycarbonate or polyamide is preferred.

Such a plastic material can be dyed, such that it is not possible to look into the inside of a housing which is delimited by the body. In another preferred variant, on the other hand, the plastic main material is transparent and thus makes it possible to see through the body. This is possible in particular when the electric or electronic functional layer of the film on the body also has a transparent action. This effect can be achieved for example using the procedure in which the electric or electronic functional layer has a plurality of conductive traces (conductor traces) which consist of metal, in particular of silver, copper, aluminum, chromium or of a metal alloy, and which have a width of between 1 µm and 40 µm (preferably between 5 µm and 25 µm), and which at the same time have a distance from each other of from 10 µm to 5 mm (it preferably lies between 300 µm and 1 mm). Such conductor traces cannot be resolved by the human eye, or are difficult for the human eye to resolve, and therefore cannot be recognized individually. The transparency of the electric functional layer is at least 70%, preferably at least 80% despite the metallic conductor traces. These conductor traces are preferably provided in a layer thickness from the range of from 10 to 150 nm, preferably from the range of from 30 to 60 nm.

In a preferred embodiment the body is provided in such a way that the film is back-injection molded with the plastic material; the named joining of the film to the plastic main material thus takes place automatically during the process of back-injection molding. Alternatively or in addition, the plastic main material can be glued (in areas) and/or clamped (in areas) and/or laminated onto the plastic material.

In the body, to make the injection molding easier, an adhesion-promoter layer can be provided at least on the part of the film back-injection molded with plastic. In this way a particularly good bond of the components plastic main material and film is ensured.

Preferred embodiments of the invention are described in more detail below with reference to the drawings, in which FIGS. 2a, 2b illustrate a first embodiment of the invention, wherein FIG. 2b is a top view, and wherein FIG. 4c illustrates a section of a first variant of the third embodiment according to FIG. 4a, and FIGS. 4d, 4e illustrate a section and, respectively, a top view of a second variant of the third embodiment according to FIG. 4a, FIG. 5a illustrates a fourth embodiment of the invention in a section corresponding to FIG. 4a and FIG. 5b illustrates an enlargement of the embodiment according to FIG. 5a, FIGS. 6a, 6b illustrate a fifth embodiment of the invention, wherein FIG. 6a represents a section and FIG. 6b a top view, FIGS. 7a, 7b represent a top view of a sixth embodiment of the invention, wherein FIG. 7b shows a magnification of the partial section on the right in FIG. 7a, and FIG. 8 shows a section of a modification of the body of FIGS. 1-7b.

Figure 1A:
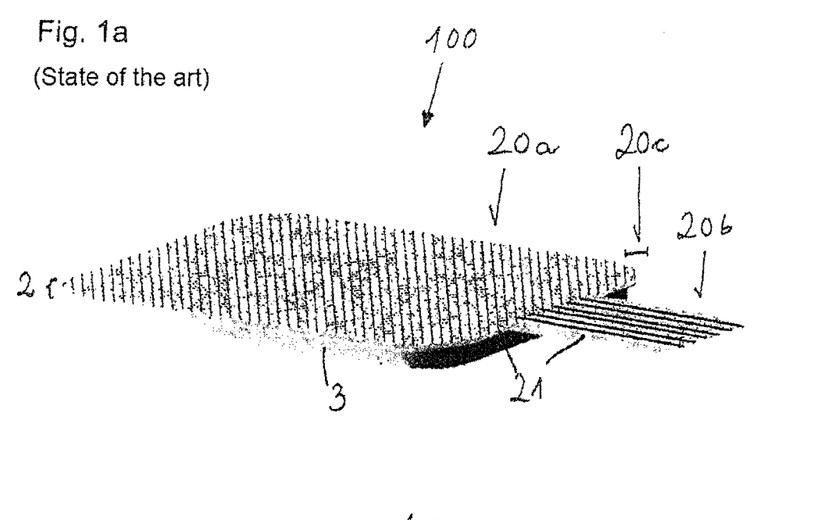
FIG. 1a illustrates a perspective view, and FIG. 1b a top view of a plastic part as body according to the state of the art.
Figure 1B:
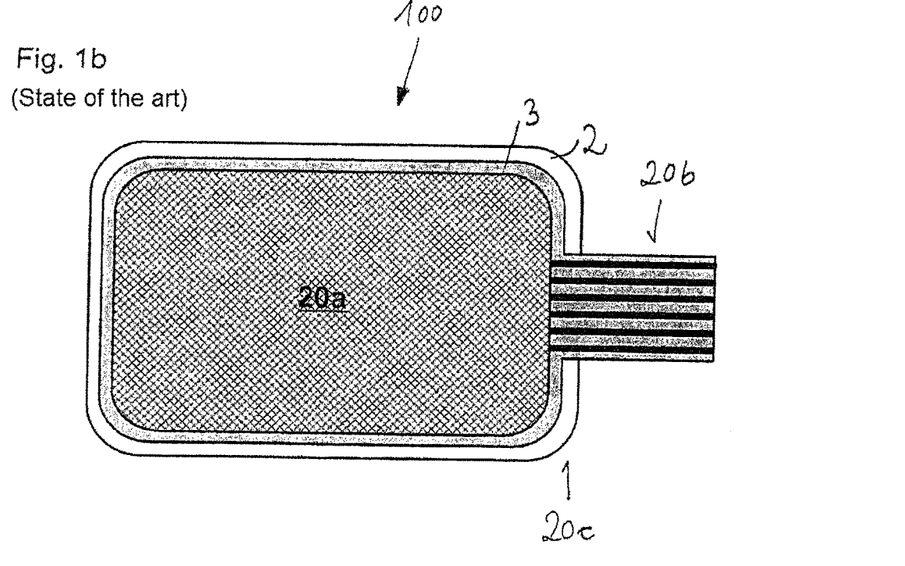

A body shown in FIGS. 1a and 1b and denoted 100 throughout comprises a film 2 and injection-molding material 3. The layer thicknesses of the individual components are not shown to scale. The film 2 forms a film element which comprises a substrate 21 which adheres, via an adhesion-promoter layer not shown in the figure (also called "primer"), to the injection-molding material 3. It is not the entire film 2 that is back-injection molded, but only a first area 20a of the film 2, whereas a second area 20b of the film 2 is not back-injection molded. The first area 20a is in particular a functional area and the second area 20b is a contact area. In a transition area 20c the film 2 protrudes beyond the injection-molding material 3.

In the present case, the film is to comprise an electric functional layer 22 on the substrate 21, for example in the form of capacitive elements for providing a touch panel functionality (with the result that the film 2 is a sensor film). Alternatively or in addition, it is possible for the film 2 to carry light-emitting diode elements, e.g. organic light-emitting diodes ("OLEDs").

The electric functional layer 22 in the present case is preferably provided in the form of a metal layer which comprises silver, copper, aluminum, chromium or other metals or metal compounds and alloys. The layer thickness of this metal layer is between 10 and 150 nm, typically between 30 and 60 nm. The metal layer is in particular not continuous, but comprises metallic conductor traces in an either particularly regular or precisely irregular pattern, wherein the conductor traces in each case have a width of between 1 µm and 40 µm, preferably approximately 5 µm and 20 µm, and have a distance from each other of between 100 µm and 5 mm, preferably of between 300 µm and 1 mm. Such metallic conductor traces cannot be recognized by the human eye without an aid. The electric functional layer 22 thereby has a transparent action, although electric components are provided at least in the form of electrical resistor elements and the like. For instance in a touch panel functionality, the individual touch panels are formed by electrical conductor traces which are galvanically coupled to each other. The capacitive coupling takes place to other touch panels which are not galvanically coupled to these conductor traces and, for their part, have a plurality of metallic conductor traces which are coupled to each other galvanically one below another.

The invention is not limited to the use of metallic conductor traces for providing a touch panel function. Any conductive and semi-conductive elements can contribute to the provision of electric and electronic components. For example, metal can be provided in the form of nanowires (for instance made of silver, copper or gold) or nanoparticles (for instance made of silver, gold or copper), carbon nanotubes or plastic nanoparticles can be provided, and finally elements made of graphene can also be provided. Moreover, organic conductors made of PEDOT/PSS (poly-3,4-ethylenedioxythiophene-polystyrenesulfonate) or of PAni (polyaniline) can be provided. In particular, active electric components such as for example organic light-emitting diodes, inorganic or organic photovoltaic cells, other display elements such as for instance made of electroluminescent materials, electrochromic materials or electrophoretic materials can be provided, integrated circuits or inorganic or organic memories can be provided. All of these can equally be used within the framework of the present invention. This applies to all of the layer or sheet structures and sequences described in this application.

The contact area 20b which has the shape of a contact flap protruding away from the functional area 20a comprises an electrical connection for the elements in the electric functional layer.

Because the contact flap sticks out, there is the danger that it will rip in the transition area between the injection-molding material 3 and the free space, or that the electric functional layer will be damaged there. The contact flap serves to connect the elements in the functional area 20a via a counter contact. The electric functional layer at the free end of the contact flap is also to be prevented from being damaged during contacting at a counter contact. A few procedures are disclosed in the following for how such damage can be prevented.

Figure 2A:
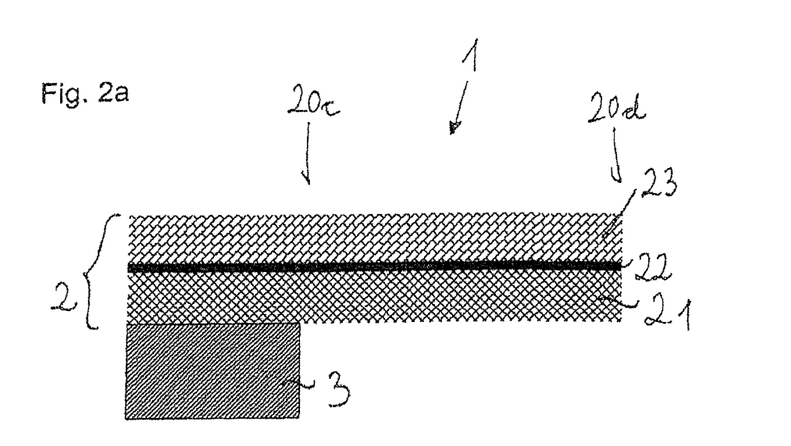
FIG. 2a represents a section in the area framed with a dashed line in FIG. 2b, FIGS. 3a, 3b illustrate a second embodiment of the invention, wherein FIG. 3a likewise represents a section and FIG. 3b a top view.
Figure 2B:
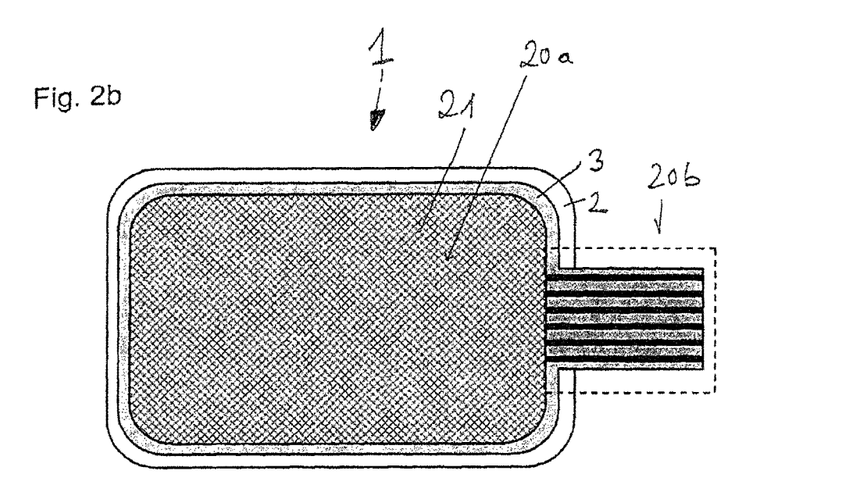

In the first embodiment of the body 1 according to the invention electrically conductive material is applied, as layer 23, to the electric functional layer 22. The electrically conductive material is applied precisely where electrically conductive material is already located also as part of the electric functional layer 22.

The material can be provided by applying an electrical conductive paste to the film 2 and can comprise or be conductive silver and/or carbon black. The application of the layer 23 takes place over the whole area in which the electric functional layer 22 is present. By such an application of the layer 23 both the transition area 20c and the free end 20d of the contact flap are protected. A prerequisite is that the layer thickness is sufficiently large, in particular lies between 1 µm and 25 µm, preferably lies between 6 and 10 µm, e.g. is 8 µm.

Figure 3A:
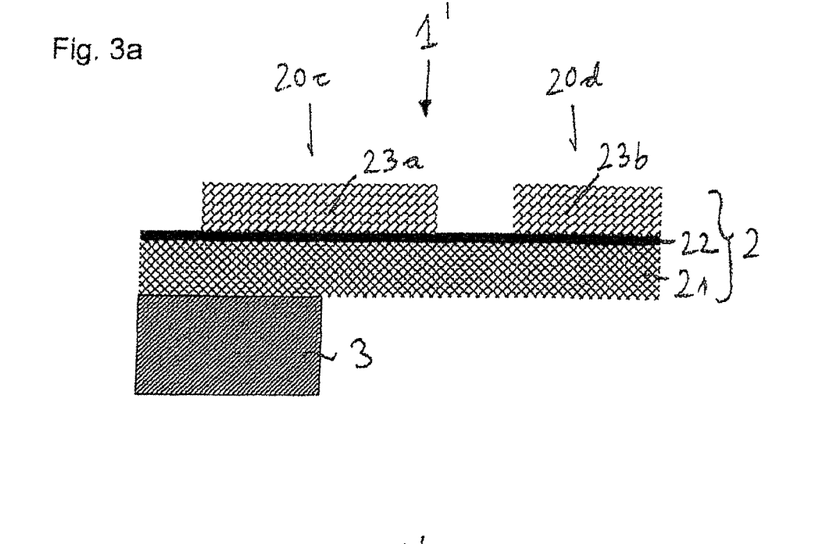
Figure 3B:
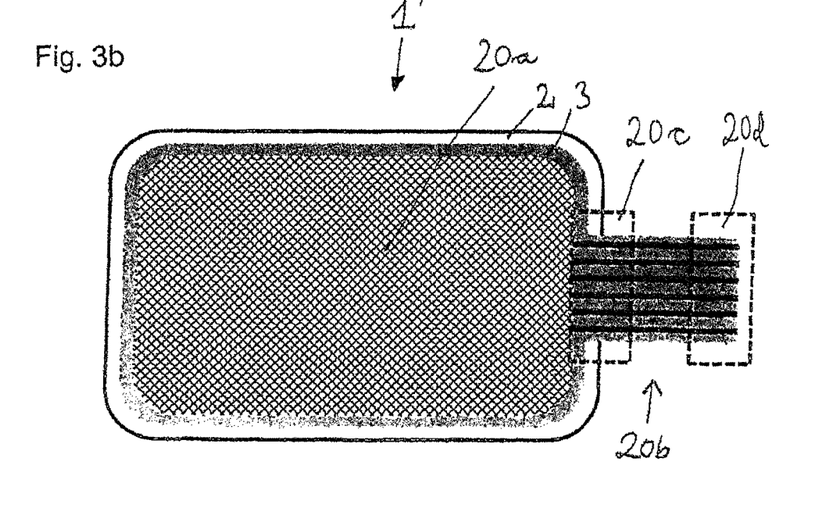

In a second embodiment of the body 1' according to the invention the electrically conductive material, thus in particular the electrically conductive paste, is not applied over the whole surface, but only in the transition area 20c between the functional area 20a and the contact area 20b (reference number 23a) and is moreover provided at the free end 20d (see reference number 23b). In the transition area 20c there is a protection during bending of the contact flap, where in the end area 20d, on the other hand, the electrical connections are protected from being damaged during contacting with a counter contact. Here, in particular in each area in which the electrically conductive material is actually applied (thus in the transition area 20c and at the free end 20d), the application is such that the electrically conductive material (thus the electrically conductive paste) is applied only where the electric functional layer also already comprises electrically conductive areas.

Figure 4A:
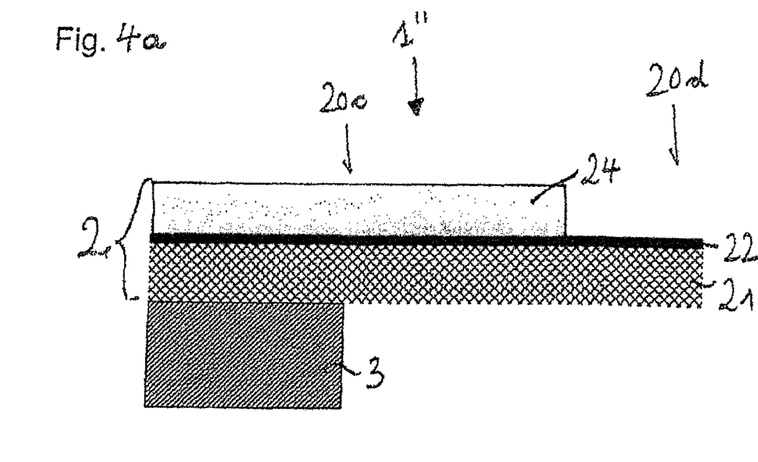
FIGS. 4a, 4b illustrate a third embodiment of the invention, wherein FIG. 4a also represents a section here and FIG. 4b a top view, wherein furthermore
Figure 4B:
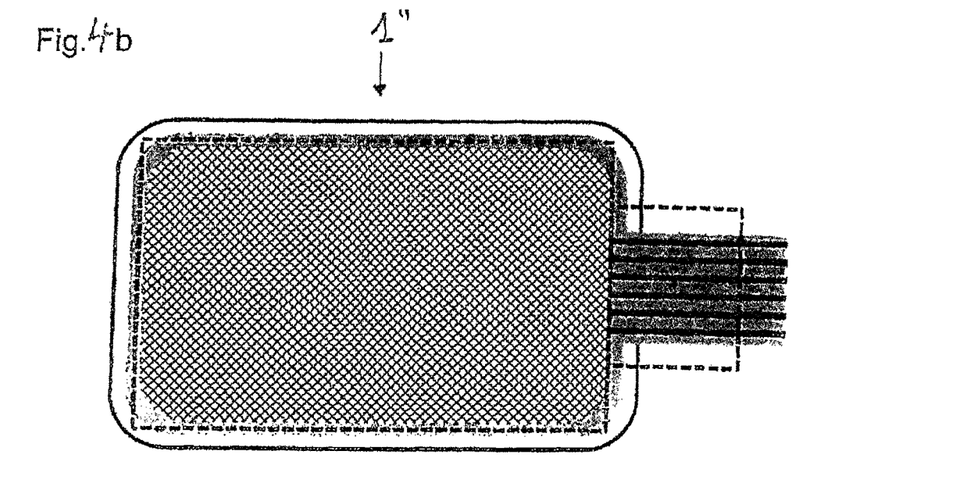

In a third embodiment of the body 1" according to the invention an electrically insulating material is provided on the electric functional layer 22 in the form of a separate varnish layer 24 or also an applied film. The electrically insulating material, however, does not extend precisely up to the free end 20d, but only includes the transition area 20c. The electrically insulating material, which can consist of the same material as the substrate 21 (for possible materials see below), thus provides protection. In the embodiment according to FIG. 1a it is provided substantially in the same layer thickness as the substrate 21 and therefore still keeps the contact flap flexible, but at the same time prevents damage to it or to the electric functional layer 22 in the transition area 20c.

Figure 4C:
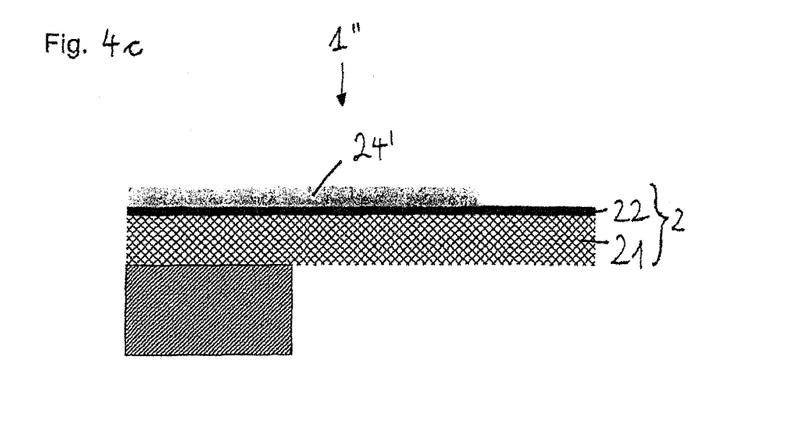

In a variant according to FIG. 4c the electrically insulating layer 24' is formed from a harder material than the substrate 21 and, for that reason, is provided thinner than the latter.

Figure 4D:
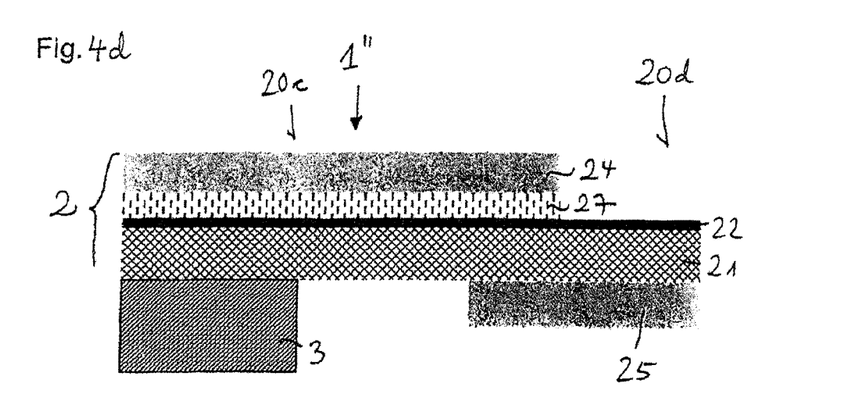
Figure 4E:
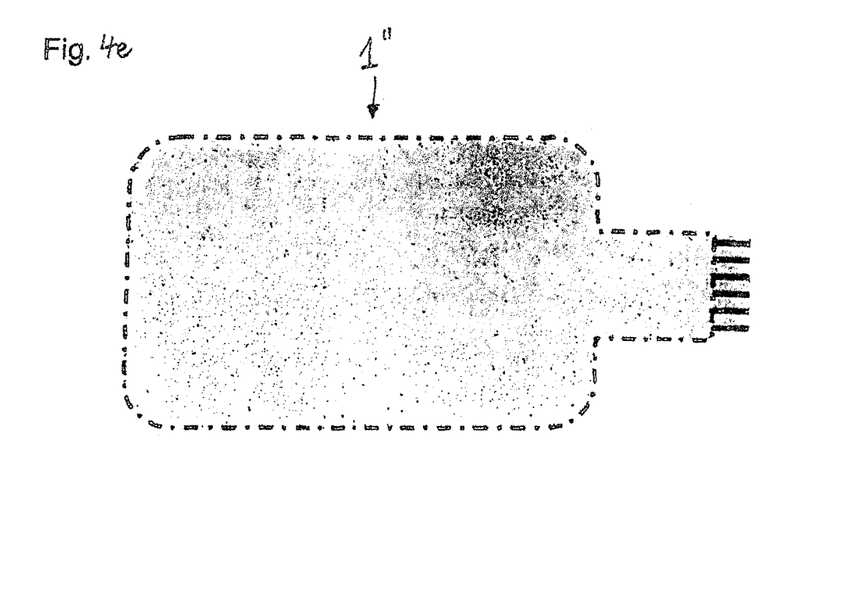

In a variant according to FIGS. 4d/e the electrically insulating layer 24 is provided in the form of a film which is secured to the electric functional layer 22 via a separate adhesive layer 27. Furthermore, a stiffening element 25 is located at the free end 20d. This extends into the area underneath the film 24 and the adhesive layer 27. In this variant it is particularly preferred if the conductive material, in particular carbon black, is additionally also provided at the free end 20d in the section 23b, as shown in FIG. 3a.

The embodiments according to FIGS. 3a/b on the one hand and FIGS. 4a to c on the other hand can be combined with each other to form an embodiment of the body 1''' according to the invention: not only can conductive material, as shown in FIG. 3a, be provided in the corresponding areas as sections 23a and 23b, but the section 23a, possibly partially the section 23b, is also covered by electrically insulating material 24", wherein however the free end 20d is left exposed, in order that an electrical contacting can take place in the area of the free end 20d.

As can be seen from FIG. 4e, the adhesive layer 27 and the film 24 are applied to the substrate 21 and the functional layer 22 practically over the whole surface, cf. in particular the area framed with a dashed line in FIG. 4e; only the free end 20d remains uncovered for the electrical contacting.

Figure 5A:
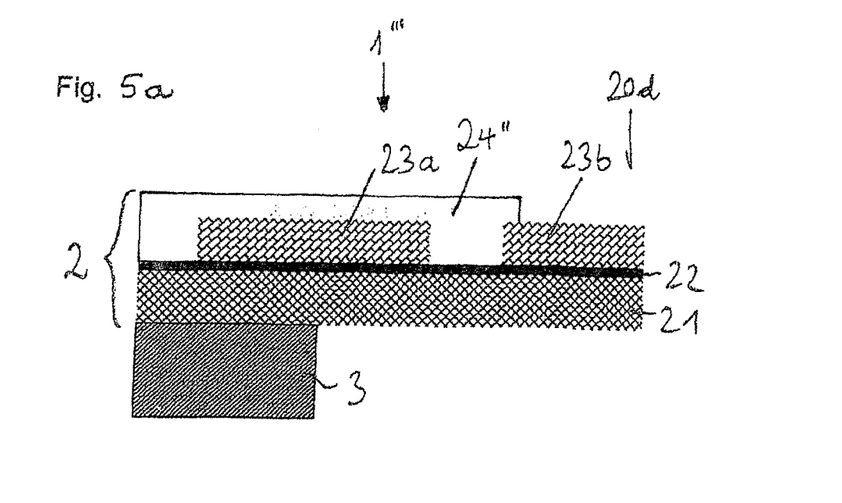
Figure 5B:
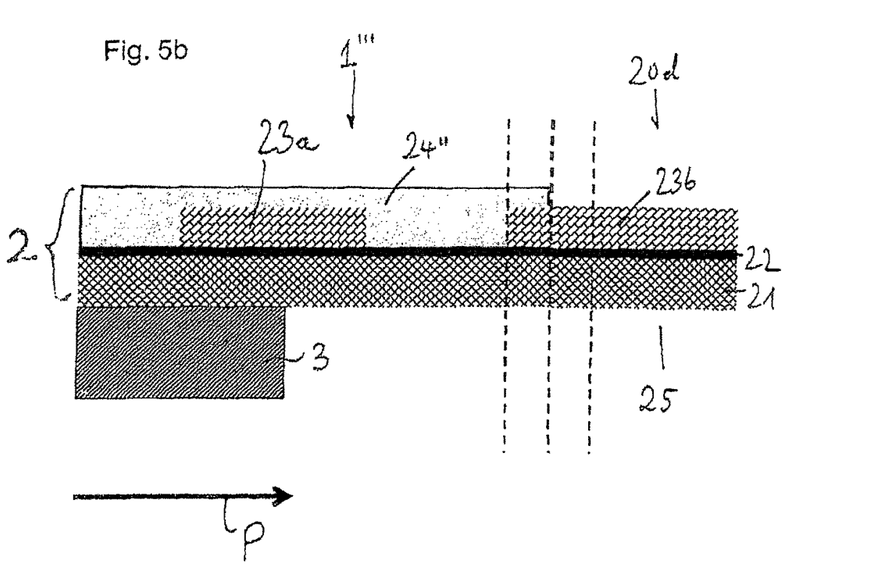

In addition, as shown in FIG. 5b, a stiffening element 25 can also be attached to the side of the substrate 21 facing away from the electric functional layer 22 at the free end 20d. As represented by the dashed lines, the section 23b in the layer with the electrically conductive paste first begins in the direction away from the injection-molding material 3 (cf. the arrow P), then the provision of the electrically insulating material 24" ends, and the strengthening element 25 then begins.

Figure 6A:
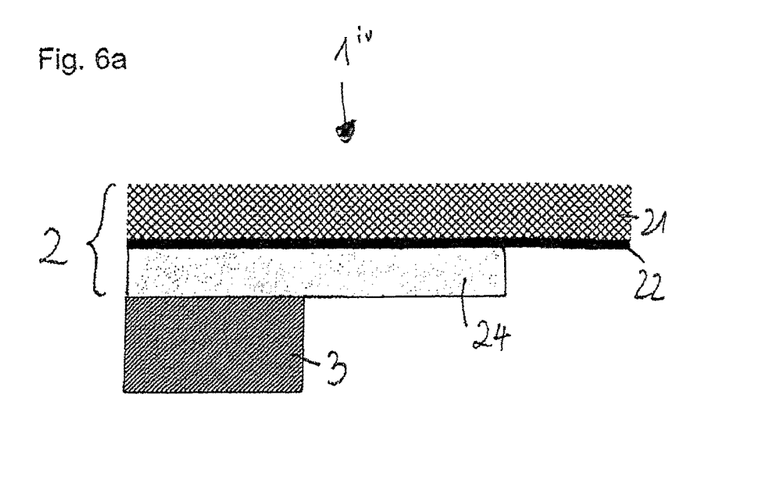
Figure 6B:
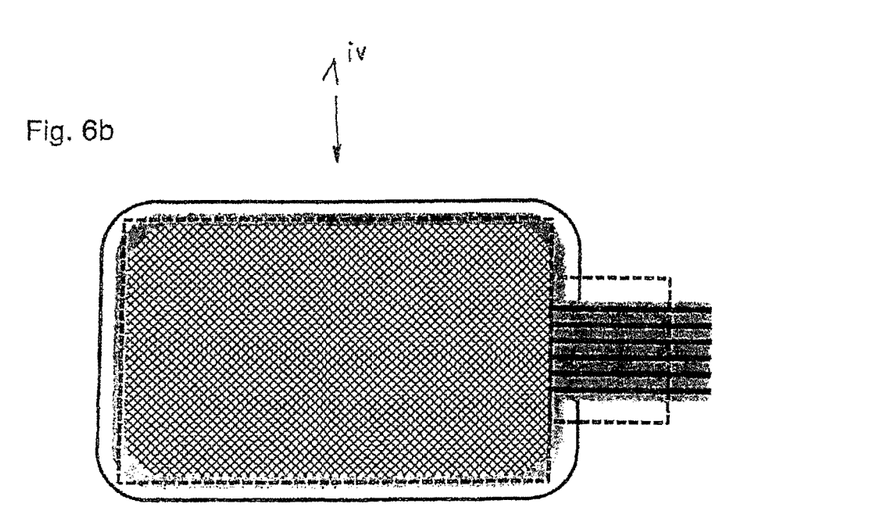

In a fifth embodiment of the body 1$^{iv}$ according to the invention according to FIGS. 6a/b the electric functional layer 22 points towards the injection-molding material 3. As electrically insulating material 24 is applied to the functional layer 22, this electrically insulating layer 24 also points towards the plastic material 3. Thus it is not the substrate 21 that adheres to the plastic material 3, but the electrically insulating material 24.

Figure 6C:
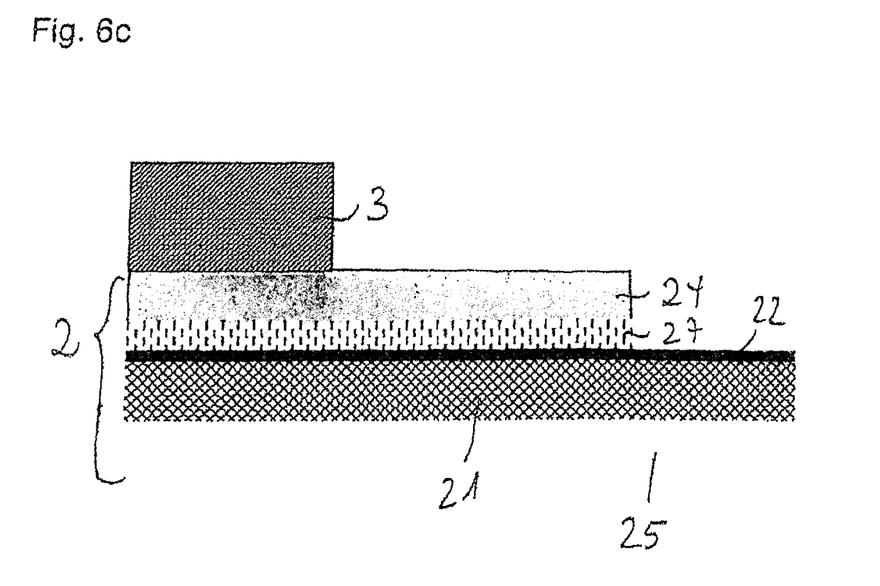
FIG. 6c illustrates a section of a variant of the sixth embodiment of the invention.

In a variant of this embodiment according to FIG. 6c the electrically insulating material 24 is present in the form of a film which is applied to the functional layer 22 via the adhesive layer 27, as explained above with reference to FIGS. 4d/e. In this variant it is particularly preferred if the conductive material, in particular carbon black, is also additionally provided at the free end 20d in the section 23b, as shown in FIG. 3a.

In principle, in the two variants of the fifth embodiment according to FIGS. 6a/6b and 6c it would also be possible to provide electrically conductive paste on the electric functional layer 22, which would then likewise point to the plastic material 3.

In the embodiments according to FIGS. 6a/6b and 6c an additional adhesion-promoting layer, in particular a so-called primer layer or an adhesive layer, can in particular also be provided between the plastic material 3 and the insulating material 24. Alternatively, the layer with the insulating material 24 can also have self-adhesive properties.

Figure 7A:
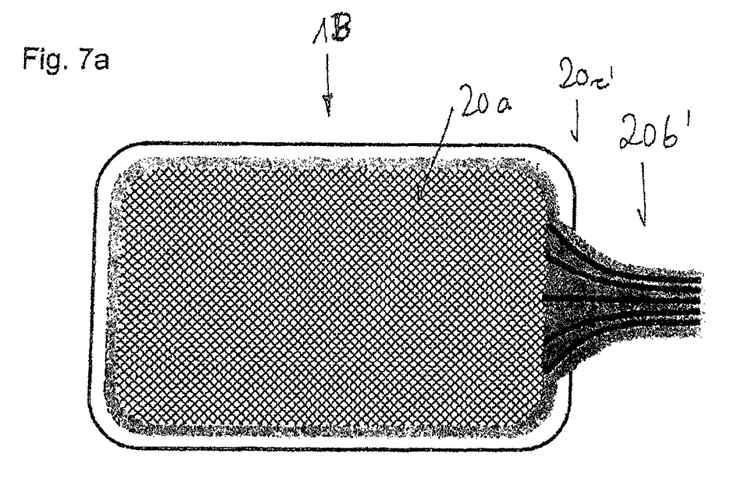
Figure 7B:
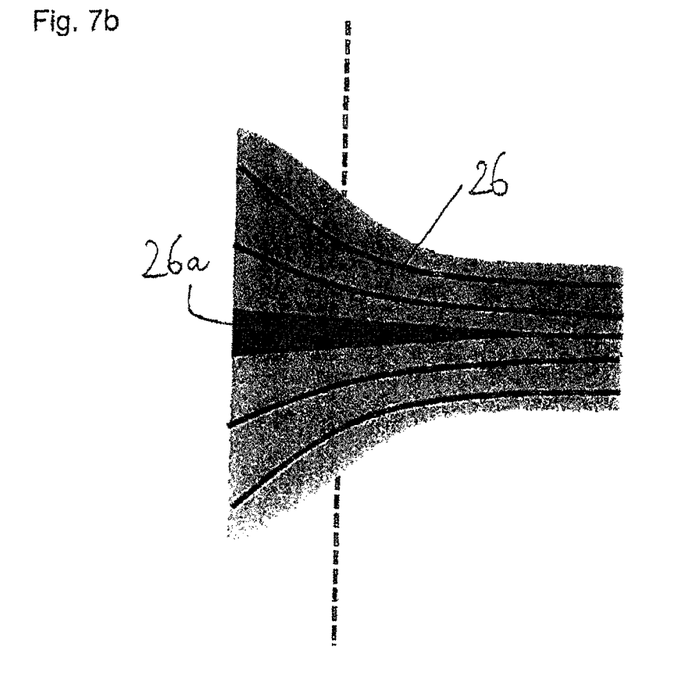

FIG. 7a with FIG. 7b shows a sixth embodiment of the body 1B according to the invention: the contact area 20b' protrudes away from the functional area 20a such as in the state of the art according to FIGS. 1a/1b but, instead of a substantially rectangular flap as in the state of the art, a tapering is provided in the contact area 20b'. As revealed by FIG. 7a and in particular also the magnification according to FIG. 7b, square corners are effectively avoided here as potential rip sites. Electrical contact traces 26 likewise widen at least partially towards the functional area 20a, see in particular the central contact trace 26a in FIG. 7b.

After the representation of the different embodiments for a body according to the invention, a few specifications of details, in particular of a few important values, now follow.

The substrate 21 preferably consists of plastic, for example polyethylene terephthalate, polypropylene, polycarbonate, polyethylene naphthalate, polyamide and similar materials, wherein the substrate 21 has a layer thickness of from 12 to 600 µm, in particular of from 12 to 150 µm, typically of from 35 to 60 µm.

The electrically insulating material 24 can consist of the same materials, wherein in one body the substrate 21 can be formed as first material and another material can be selected from the above-named for the electrically insulating material 24.

On the electric functional layer 22 or the further layers 23, 23a, 23b, 24, 24' a protective layer not shown in the figures can also be provided which can consist for example of polyacrylate, polyvinyl chloride, polyvinyl acetate, polyurethane, polycarbonate, polyester, an ethylene vinyl acetate copolymer, a hydrocarbon resin, chlorinated polyolefin, polyvinyl alcohol, melamine resin, ketone; formaldehyde resin, polyvinylidene fluoride, epoxy resin, polystyrene, a polymeric cellulose compound, phenolic resin, polyamide, polymeric liquid crystals (LCPs), urea resin and synthetic resin or can comprise these materials, or can consist of combinations of these substances or can comprise these. This includes both thermal and radiation-cured varnish systems.

The layer thickness of the protective layer can lie between 2 and 6 μm. The protective layer in this case also contributes to the prevention of damage to the contact flap or the electric functional layer.

The adhesion-promoter material (primer) not shown in the figure can have a layer thickness of between 1 and 9 μm, preferably of between 1 and 5 μm. It preferably consists of the following material:

| Component | Proportion (%) |
|---|---|
| Methyl ethyl ketone | 60 |
| Butyl acetate | 15 |
| MMA polymer (Tg: 100° C.) | 07 |
| MMA/EA copolymer (Tg: 35° C.) | 13 |
| Silicate (SiO$_2$) | 05 |

Tg here is the glass transition temperature (freezing temperature) of the respective component.

All thermoplastics can be used as injection-molding material 3, these are preferably polymethyl (meth)acrylate, acrylonitrile butadiene styrene, polycarbonate or polyamide.

The injection-molding material can be colored or transparent. It can comprise fillers such as glass fibers or carbon fibers, or also be provided without fillers.

The film 2 can also be colored or transparent, wherein it is also possible for only some areas to be colored and the others to be transparent, e.g. the functional area 20a can be colored and the contact flap in the contact area 20b can be transparent, and vice versa. The layers 23 and 24 can also be colored completely or in areas or be transparent completely or in areas.

In the previously described embodiments an edge is always located underneath the transition area 20c between the functional area 20a and the contact area 20b, because that is where the plastic material 3 ends.

Figure 8:
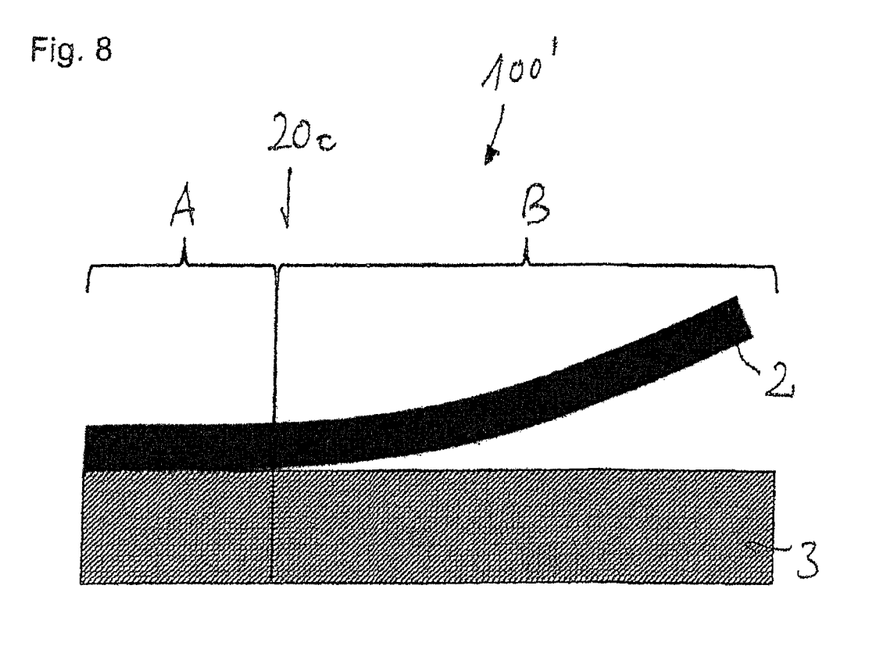

However, a back-injection molding can also take place such that plastic material is still located underneath the contact flap, as indicated in FIG. 8: in this case, although the contact flap protrudes, it could in principle be placed on the plastic material 3. Advantages can thereby be achieved during the contacting, for instance when the plastic material 3 is to be fixedly installed in a device and the contact flap 2 is to be guided inside the device to a counter contact.

The invention claimed is:

1. A film comprising:
a substrate film;
at least one electric or electronic functional layer on the substrate film;
at least one electric and/or electronic component is provided in a functional area of the functional layer, and wherein at least one electrical connection contact is provided in a contact area of the at least one functional layer, which electrical contact is galvanically coupled to at least one component, and wherein the film has a contact flap which provides at least one part of the contact area;
wherein a further layer is applied, in a thickness of at least 300 nm, to the functional layer in a transition area between the functional area and the contact area, which comprises at least a partial area of the contact flap;
wherein the further layer comprises an electrically conductive material;
wherein electrically conductive material is provided at a free end of the contact flap and covers the electrical connection of the functional layer; and
wherein the electrically conductive material is provided on the electric functional layer only in areas, and the electrically insulating material covers the electrically conductive material in the transition area, but leaves electrically conductive material exposed at the free end.

2. The film according to claim 1, in which the further layer comprises an electrically insulating material.

3. The film according to claim 2, in which the electrically insulating material comprises polymethyl (meth)acrylate, polycarbonate and/or acrylonitrile butadiene styrene and/or contains zinc oxide particles.

4. The film according to claim 2, in which the electrically insulating material is provided in the form of a varnish.

5. The film according to claim 2, in which the electrically insulating material is provided in the form of a separate film.

6. The film according to claim 5, in which the separate film is secured to the functional layer by means of an adhesive layer.

7. The film according to claim 2, in which the substrate carries the electric or electronic functional layer and the electrically insulating material has a thickness deviating from the thickness of the substrate by at most +/−10%.

8. The film according to claim 2, in which the substrate carries the electric or electronic functional layer and the electrically insulating material is harder and thinner than the substrate.

9. The film according to claim 1 including a transition area on the film, in which in the transition area the contact flap tapers away from the functional area, and reduces its width in particular by at least 20%, preferably at least 40% of an initial width.

10. The film according to claim 1, in which the electrically conductive material comprises conductive silver or carbon black.

11. The film according to claim 1, with a stiffening element on the side of the film facing away from the functional layer.

12. The film according to claim 11, in which the stiffening element comprises polyethylene terephthalate, polypropylene, polycarbonate or polyethylene naphthalate.

13. The film according to claim 1, in which the functional layer has a plurality of conductor traces which consist of metal, in particular of silver, copper, aluminum, chromium or of a metal alloy, and which have a width of between 1 μm and 40 μm and have a distance from each other of between 10 μm and 5 mm and are provided in a layer thickness of from 10 to 150 nm.

14. The film according to claim 1, in which the functional layer has a plurality of conductor traces which consist of metal, in particular of silver, copper, aluminum, chromium or of a metal alloy, and which have a width of 100 μm or more.

15. The film according to claim 1, in which the functional layer comprises metal nanowires, in particular made of silver, copper, gold and/or metal nanoparticles, in particular made of silver, copper or gold and/or carbon nanotubes, carbon nanoparticles, graphene and/or organic conductors such as PEDOT/PSS and/or polyaniline and/or provides active electric components, in particular organic light-emitting diodes, inorganic or organic photovoltaic cells, display elements provided using electroluminescent materials, electrochromic materials and/or electrophoretic materials, integrated circuits and/or inorganic or organic memories.

16. The film according to claim 1, with a substrate made of plastic, in particular made of polyethylene terephthalate, polypropylene, polycarbonate, polyethylene naphthalate, which carries the functional layer and is preferably provided in a thickness of between 12 and 150 μm.

17. The film according to claim 1, in which the contact flap tapers and in which the functional layer has, in the contact area to at least one connection, a contact trace which widens towards the transition area.

18. The film according to claim 1, in which the functional area has a touch sensor as component, in particular a touch sensor providing measurement signals according to a capacitive principle of operation.

19. A body comprising:
the film according to claim 1, which film is partially joined to a plastic main material such that the contact area is at least partially free from plastic main material, with the result that the contact flap protrudes from the functional area.

20. The body according to claim 19, in which the plastic main material is a thermoplastic which comprises in particular polymethyl (meth)acrylate, acrylonitrile butadiene styrene, polycarbonate and/or polyamide.

21. The body according to claim 19, in which the plastic main material is transparent at least in areas.

22. The body according to claim 19 in which the substrate is arranged between the functional layer and the plastic main material.

23. The body according to claim 19 in which the functional layer is arranged between the substrate and the plastic main material.

24. The body according to claim 19, in which the film is back-injection molded with the plastic main material and/or glued and/or clamped to the plastic main material and/or laminated onto the plastic main material.

25. The body according to claim 19, with an adhesion-promoter layer at least on the part of the film back-injection molded with plastic.

* * * * *